United States Patent
Hill et al.

(10) Patent No.: US 10,607,806 B2
(45) Date of Patent: Mar. 31, 2020

(54) SILICON ELECTRON EMITTER DESIGNS

(71) Applicant: KLA-TENCOR CORPORATION, Milpitas, CA (US)

(72) Inventors: Frances Hill, Sunnyvale, CA (US); Gildardo R. Delgado, Livermore, CA (US); Rudy F. Garcia, Union City, CA (US); Michael E. Romero, San Jose, CA (US); Katerina Ioakeimidi, San Francisco, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/153,103

(22) Filed: Oct. 5, 2018

(65) Prior Publication Data
US 2019/0108963 A1    Apr. 11, 2019

Related U.S. Application Data

(60) Provisional application No. 62/570,438, filed on Oct. 10, 2017.

(51) Int. Cl.
*H01J 1/304* (2006.01)
*H01J 37/073* (2006.01)
(Continued)

(52) U.S. Cl.
CPC ........ *H01J 37/073* (2013.01); *G02B 27/0927* (2013.01); *H01J 1/3044* (2013.01);
(Continued)

(58) Field of Classification Search
CPC ........... G02B 27/0927; H01L 21/67288; H01J 1/3044; H01J 19/24; H01J 1/34; H01J 40/06; H01J 40/18; H01J 2237/2817; H01J 2237/06333; H01J 2237/24521; H01J 2237/24592; H01J 2201/308;
(Continued)

(56) References Cited

U.S. PATENT DOCUMENTS 5,363,021 A   11/1994   MacDonald
7,074,719 B2   7/2006   Kim et al.
(Continued)

FOREIGN PATENT DOCUMENTS

| CN | 102353817 | * | 2/2012 | ............ G01Q 60/40 |
| CN | 104561901 A | | 4/2015 | |
| CN | 105197878 A | | 12/2015 | |

OTHER PUBLICATIONS

Kang et al., Electron emission from silicon tips coated with sol-gel (Ba0.67Sr0.33)TiO3 ferroelectric thin film 2001, J. Vac. Sci. Technol. B 19(3), pp. 1074-1076, May-Jun. 2001 (Year: 2001).*
(Continued)

*Primary Examiner* — Nikolay K Yushin
(74) *Attorney, Agent, or Firm* — Hodgson Russ LLP

(57) ABSTRACT

Electron source designs are disclosed. The emitter structure, which may be silicon, has a layer on it. The layer may be graphene or a photoemissive material, such as an alkali halide. An additional layer between the emitter structure and the layer or a protective layer on the layer can be included. Methods of operation and methods of manufacturing also are disclosed.

16 Claims, 9 Drawing Sheets

(51) Int. Cl.
| | |
|---|---|
| *H01J 37/26* | (2006.01) |
| *G02B 27/09* | (2006.01) |
| *H01J 40/06* | (2006.01) |
| *H01J 40/18* | (2006.01) |
| *H01J 19/24* | (2006.01) |
| *H01J 37/06* | (2006.01) |
| *H01J 37/28* | (2006.01) |
| *H01J 1/34* | (2006.01) |
| *H01L 21/67* | (2006.01) |

(52) U.S. Cl.
CPC .............. *H01J 19/24* (2013.01); *H01J 37/06* (2013.01); *H01J 37/26* (2013.01); *H01J 37/28* (2013.01); *H01J 40/06* (2013.01); *H01J 40/18* (2013.01); *H01J 1/34* (2013.01); *H01J 2201/308* (2013.01); *H01J 2201/3048* (2013.01); *H01J 2201/30411* (2013.01); *H01J 2201/30449* (2013.01); *H01J 2201/3423* (2013.01); *H01J 2201/3425* (2013.01); *H01J 2201/3426* (2013.01); *H01J 2237/06333* (2013.01); *H01J 2237/24521* (2013.01); *H01J 2237/24592* (2013.01); *H01J 2237/2817* (2013.01); *H01L 21/67288* (2013.01)

(58) Field of Classification Search
CPC ....... H01J 2201/3423; H01J 2201/3425; H01J 2201/30411; H01J 2201/3048; H01J 2201/3426; H01J 2201/30449; H01J 37/06; H01J 37/26; H01J 37/28; H01J 37/073; H01J 19/06; H01J 19/18
See application file for complete search history.

(56) References Cited

U.S. PATENT DOCUMENTS

| | | | |
|---|---|---|---|
| 7,507,958 | B2 | 3/2009 | Choi et al. |
| 2006/0055321 | A1 | 3/2006 | Maldonado et al. |
| 2007/0235717 | A1 | 10/2007 | Heo et al. |
| 2014/0265828 | A1 | 9/2014 | Maldonado et al. |
| 2015/0309073 | A1* | 10/2015 | Mirkin ................. B82Y 40/00 850/55 |
| 2018/0005791 | A1 | 1/2018 | Schultz et al. |
| 2018/0174794 | A1 | 6/2018 | Delgado et al. |

OTHER PUBLICATIONS

Fairchild et al., "Low work function CsI coatings for enhanced field emission properties", 2011, J. Vac. Sci. Technol. A 29 (3), pp. 031402-1-031402-6, published Apr. 13, 2011 (Year: 2001).*

ISA/KR, International Search Report and Written Opinion for PCT/US2018/055284 dated Mar. 26, 2019.

Chang et al., Enhanced electron field emission properties from hybrid nanostructures of graphene/Si tip array, RSC Advances, 2015, vol. 5, pp. 2928-2933.

Cho et al., "Growth of monolayer graphene on nanoscale copper-nickel alloy thin films," Carbon, 115, 2017, pp. 441-448.

Wenger et al., "Graphene based electron field emitter," Journal of Vacuum Science & Technology B, vol. 33, No. 1, Jan. 2015, 01A109-1-4.

Shao et al., "Graphene-Based Cathode Cold-Field Electron Emission Sources," Abstract.

Shao et al., "A high-brightness large-diameter graphene coated point cathode field emission electron source," Nature Communications, 2018, vol. 9, pp. 1-8.

Wu et al., Field Emission of Single-Layer Graphene Films Prepared by Electrophoretic Deposition, Advanced Materials, 2009, 1756-1760.

* cited by examiner

SILICON ELECTRON EMITTER DESIGNS

CROSS-REFERENCE TO RELATED APPLICATIONS

This application claims priority to the provisional patent application filed Oct. 10, 2017 and assigned U.S. App. No. 62/570,438, the disclosure of which is hereby incorporated by reference.

FIELD OF THE DISCLOSURE

This disclosure relates to electron emitters.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Electron beams are used in a number of different applications during semiconductor manufacturing. For example, electron beams can be modulated and directed onto an electron-sensitive resist on a semiconductor wafer, mask, or other workpiece to generate an electron pattern on the workpiece. Electron beams also can be used to inspect a wafer by, for example, detecting electrons emerging or reflected from the wafer to detect defects, anomalies or undesirable objects.

These inspection processes are used at various steps during a semiconductor manufacturing process to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As semiconductor devices become smaller, it becomes more important to develop enhanced inspection and review tools and procedures to increase the resolution, speed, and throughput of wafer and photomask/reticle inspection processes. One inspection technology includes electron beam-based inspection such as use of a scanning electron microscope (SEM). An SEM uses an electron source. A typical SEM has an electron beam column that includes an electron source to generate one or more electron beams and electron beam elements to focus or deflect the electron beams across a wafer, which is held on a movable support.

Lanthanum hexaboride ($LaB_6$) emitters, Schottky thermal field emitters (TFE), or tungsten cold field emission (CFE) emitters are commonly used as electron sources. These electron sources provide reliable sources of electrons and show good long term stability, noise figure, and brightness. However, they are unable to meet resolution and throughput requirements in the semiconductor industry.

Electron sources can be divided into three broad groups: thermionic sources, field emission sources, and photocathodes. Thermionic sources are usually made of tungsten or lanthanum hexaboride. In thermionic emission, electrons are boiled off the material surface when the electron thermal energy is high enough to overcome the surface potential barrier. Even though thermionic emitters are widely used, they typically require elevated temperatures (e.g., >1300 K) to operate, and may have several drawbacks such as inefficient power consumption, wide energy spread, short lifetime, low current density, and limited brightness. The demand for more efficient electron sources has driven the research and development of Schottky emitters and cold field electron sources.

In the Schottky emitters, thermionic emission is enhanced by effective potential barrier lowering due to the image charge effect under an applied external electric field. Schottky emitters are typically made of a tungsten wire having a tip coated with a layer of zirconium oxide ($ZrO_x$), which exhibits a low work function (e.g., approximately 2.9 eV). Schottky emitters are currently used in some electron beam systems. Despite being quite successful, thermally-assisted Schottky emitters still need to be operated at high temperature (e.g., >1000 K) and high vacuum (e.g., approximately $10^{-9}$ mbar), and have wider than desirable electron emission energy spread due to the high operating temperature.

Cold electron sources, particularly electron field emitters, have been used in field emission displays, gas ionizers, x-ray sources, electron beam lithography, and electron microscopes, among other applications. Field emission takes place when the applied electric field is high enough to reduce the potential barrier on the tip-vacuum interface so that electrons can tunnel through this barrier at a temperature close to room temperature (e.g., quantum-mechanical tunneling). A typical field-emitter comprises a conical emitter tip with a circular gate aperture. A potential difference is established across the emitter cathode, the gate and the anode under an applied external field, resulting in high electric field at the surface of the tip. Electrons tunnel through the narrow surface barrier and travel towards an anode, which is biased at a higher potential than the gate. The emission current density can be estimated by a modified version of the Fowler-Nordheim theory, which takes into account the field enhancement factor due to the field emitters.

Field emitters, because they can operate near room temperature, have lower energy spread than Schottky and thermionic emitters, and can have higher brightness and electron current than thermionic emitters. However, in practical use, the output current of a field emitter is less stable because contaminants can stick to the tip of the emitter and raise its work function, and hence lower the brightness and current. Additionally, adsorption or desorption of these contaminants from the surface of the emitter tips over time can cause the work function to fluctuate and can lead to instability in the beam current. Periodic flashing (i.e., temporarily raising the tip temperature) is required to remove those contaminants. While the tip is being flashed, the instrument is not available for operation. Instruments in the semiconductor industry are required to operate continuously and stably without interruption, so Schottky emitters are usually used in preference to cold field emitters.

Previous field emitter arrays (FEAs) had multiple conically shaped electron emitters arranged in a two-dimensional periodic array. These field emitter arrays can be broadly categorized by the material used for fabrication into two categories: metallic field emitters and semiconductor field emitters.

Photocathodes also have been used to generate electron beams. A single light beam incident on a photocathode system can generate a single electron beam with high brightness that is capable of delivering high electron current density. However, a problem with single electron beam systems is that even with high brightness systems, single electron beam systems still have relative low throughput for inspection. Low throughput is a drawback to electron beam inspection. With current available electron beam sources, thousands of beams would be required.

For many electron emitters, silicon is a good candidate material for making nanotips because of well-established silicon microfabrication techniques. However, silicon emitters are highly susceptible to oxidation, which converts the emitter tip to a silicon oxide. The silicon oxide will render the tip inoperable for electron emission due to the high work function of the silicon oxide. Stability also is affected by presence of silicon oxide on the emitter.

Emitters with small tip diameters (e.g., 100 nm or less) used for electron emission also are affected by vacuum conditions. The vacuum conditions can deteriorate field emission performance. Typical electron emitters do not have protective coating to protect from oxidation or carbon build up. A carbon layer grows on the surface of the cathode tips during electron beam emission under ultra-high vacuum (UHV) conditions. Oxidation of surfaces in UHV environments is also likely. Previous emitter designs also were not robust to cleaning of, for example, oxidation or carbon layers.

Schottky thermal field emitters are sensitive to environmental vacuum conditions and require vacuum levels of $10^{-9}$ Torr or better for stable operation. Schottky thermal field emitters also have limited brightness and energy spreads of approximately 0.7 eV. Demands on the emitter brightness, virtual source size, and energy spread are not met with these conventional sources for inspection systems as the defect sizes get smaller. In addition, Schottky emitters operate at 1800 K and tungsten CFE emitters have to be periodically cleaned by flashing at temperatures of up to 1000° C. to clean surface adsorbate contamination, and this heat becomes a problem in an array format because it causes thermal drift of the precise placement of the emitter to extractor alignment that is needed.

For faster inspection of wafers and reticles, defect inspection systems comprising arrays of electron beam columns become an attractive alternative to inspection systems comprising a single column because having multiple columns that operate in parallel reduces the overall inspection time required. For such systems with multiple column, such as those with up to hundreds or thousands of columns that operate at the same time, there is a need for electron sources that can be made in arrays using batch-manufacturing techniques. In these arrays, each emitter should have nearly identical properties, geometries, and performance.

Cold field emission electron sources from emitters with nanoscale diameter tips can produce beams of electrons with high brightness and low energy spread (e.g., 0.3 eV). As a result of their high brightness and low energy spread, electron beams from cold field electron sources can be focused into small spots with high current densities. Many different materials can be used to make cold field emitters, including silicon. A major limitation of cold field emission is the difficulty of making the electron beam current stable. The stability of the current produced by cold field emitters is orders of magnitude lower than the stability of more widely-used Schottky electron sources (a thermal field emitter made of tungsten coated with zirconium oxide). Stability in cold field emitters cannot be easily solved simply with improved vacuum. Cold field emitters made of a wide range of materials produce unsteady current even at vacuum as low as $10^{-11}$ Torr. The brightness of cold field emitters can be up to two orders of magnitude greater than the brightness of Schottky emitters, and cold field emitters typically have lower energy spread than Schottky emitters, so cold field emitters would be a valuable alternative as an electron source to Schottky emitters for a wide range of applications if their emission stability could be improved.

Cold field electron sources produce beams of electrons with high brightness and low energy spread, and beams of electrons from cold field electron sources can be focused into small spots with high current densities. A major limitation of cold field electron sources is the poor stability of the electron beam current. Silicon cold field emitters without any coating or silicon cold field emitters with a metal coating do not produce sufficiently stable electron beams to be used in many applications. Schottky emitters are currently used as alternatives to cold field emitters in many tools (SEMs for example) because Schottky emitters emit current stably even though they have lower brightness and higher energy spread compared to cold field emitters.

Therefore, an improved electron emitter is needed

BRIEF SUMMARY OF THE DISCLOSURE

An electron source is provided in a first embodiment. The electron source comprises an emitter structure that includes silicon and a layer disposed on an outer surface of the emitter structure. The layer includes one of graphene or a photoemissive material.

In an instance, the layer includes graphene. A metal layer may be disposed between the emitter structure and the layer. The metal layer can have a thickness from 10 nm to 50 nm and can include nickel, copper, iron, or platinum.

In an instance, the layer includes the photoemissive material. The photoemissive material may be an alkali halide such as CsI, CsBr, or CsTe. A metal layer may be disposed between the emitter structure and the layer and/or a protective coating may be disposed on the layer. The layer can have a thickness from 0.1 nm to 500 nm.

A plurality of the electron sources may be used. The plurality of the electron sources can form an array.

The emitter structure can have a diameter from 1 nm to 30 nm. The emitter structure can define a tip with a radius from 5 nm to 20 nm.

A method is provided in a second embodiment. Electrons are emitted from an electron source comprising an emitter structure that includes silicon and a layer disposed on an outer surface of the emitter structure. The layer includes one of graphene or a photoemissive material.

In an instance, the layer includes the graphene.

In an instance, the layer includes the photoemissive material. The photoemissive material may be an alkali halide.

The emitting can occur in a vacuum from $10^{-10}$ Torr to $10^{-12}$ Torr.

The emitting can occur at room temperature. The emitting also can occur at a temperature greater than room temperature and less than 500° C.

The emitting may be cold field emission. In particular, the layer includes an alkali halide that is used with the cold field emission.

The emitting can include both field emission and photoemission. In particular, the layer includes an alkali halide that is used with the field emission and photoemission.

A method is provided in a third embodiment. An emitter structure is etched from a silicon source. A layer is deposited on an outer surface of the emitter structure. The layer includes one of graphene or a photoemissive material.

A metal layer can be deposited on the outer surface of the emitter structure prior to depositing the layer. In particular, the layer can include the graphene and the metal layer can include nickel, copper, iron, or platinum.

A metal layer can be deposited on the outer surface of the emitter structure prior to depositing the layer. In particular, the layer includes the photoemissive material. The photoemissive material can include an alkali halide.

A protective coating can be deposited on the layer.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein provide a stable and high brightness source of electrons made of a single or array of emitters that including a layer on the emitter. The high brightness source of electrons can be used for a single electron beam or an array of electrons beam columns (miniaturized or regular sized) for inspection. The layer may be a metal coating, a photoemissive material, or graphene.

The electron sources can be made using lithographic techniques to fabricate an array of high field enhancement factor silicon pillars. After fabrication, the emitters can be coated with a metal thin film, such as ruthenium or iridium. Other coatings such as tungsten, platinum, or molybdenum, with a range of diffusion barriers also can be used. The diffusion barriers may prevent diffusion of the silicon into the metal coating.

After fabrication, the emitters can be coated with a thin film metal film that can serve as a catalyst to grow one or more layers of graphene. The graphene can act as a capping surface from which electron emission occurs.

With a photoemissive material layer, beams of electrons produced from the electron source can use a combination of electric fields, light-induced photoemission, and optionally heat.

Figure 1:
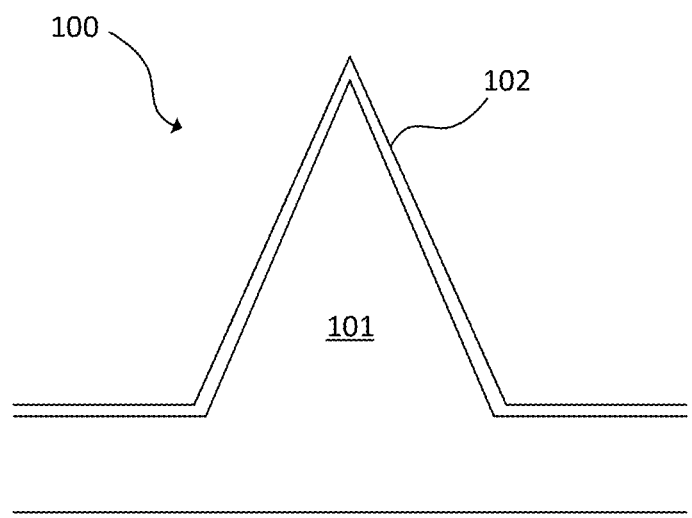
FIG. 1 is a cross-section diagram of an exemplary emitter structure with a layer in accordance with the present disclosure.

FIG. 1 is a cross-section diagram of an exemplary emitter structure 101 with a layer 102. The emitter structure 101 in the electron source 100 includes silicon. The emitter structure 101 can be crystalline silicon, polycrystalline silicon, or other materials that include silicon like a silicon-germanium alloy or silicon carbide. Thus, other species can be included with the silicon.

Silicon microfabrication processes (e.g., etching, thin film deposition, and photolithography) can be used to create a wide range of structures on silicon wafers. Emitters with any pattern on a wafer, ranging from single emitters to arrays of emitters with any required spacing or layout, can be produced. High aspect ratio emitters with an external electric field and low aspect ratio emitters with an integrated extractor electrode can be produced. With high aspect ratio emitters, the extractor is not fabricated on the wafer. Other shapes besides that illustrated in FIG. 1 can be fabricated.

High aspect ratio structures with sharpened tips (referred to as an emitter structure) can be etched into silicon. These silicon emitter structures can have high field enhancement at their tip when an external electric field is applied, and the emitters can be used to produce electron beams using cold field emission or upon exposure to light. Emitters with a variety of high aspect ratio shapes can be fabricated and used for electron emission, including tall columns, cones, or pyramid structures, all with sharpened tips. Silicon microfabrication techniques provide control over the shape and diameter of the nanoscale tip. The silicon wafers can be doped using p or n type doping to increase the conductivity of the silicon.

For example, lithographic techniques can be used to fabricate an array of accurate, repeatable silicon emitter structures 101 with high field enhancement geometry. The emitters can have tips with radii from 5 nm to 20 nm on towers having a 1.5 micron diameter and 20 micron height.

The emitter structure 101 can have an aspect ratio of approximately 12 to 15. In an example, the emitter is 20 µm tall with a 1.5 µm diameter, providing an aspect ratio of about 13.33. The emitters can be taller, shorter, wider, or narrower, and this is merely listed as one example. Taller structures have higher field enhancement and can be operated with lower voltages. For emitters with extractors that are not integrated on the wafer, higher aspect ratios generally make the emitters easier to operate because a lower emitter-to-extractor voltage will be required, although such emitters can be more difficult to fabricate due to the higher aspect ratios. Graphene, photoemissive materials, or other materials can be coated on a structure with a range of aspect ratios, including those disclosed herein.

The emitter structure 101 can have a diameter from 1 nm to 1.5 μm, including all values to the 0.1 nm and ranges in between. In an instance, the emitter structure 101 can have a diameter of 1.5 μm. In another instance, the emitter structure 101 can have a diameter of 1 nm to 30 nm. Larger diameter emitter structures 101 are possible. For example, the height can be from 10 nm to 500 μm and the diameter can be from 10 nm to 50 μm. Graphene, photoemissive materials, or other materials can be coated on a structure with a range of heights and diameters, including those disclosed herein.

The emitter structure defines a tip with a radius from 5 nm to 20 nm. However, larger radii are possible. For example, the tip may have a radius up to 100 nm.

The layer 102 is disposed on an outer surface of the emitter structure 101. A layer 102 that includes a photoemissive material, graphene, or a metal material can have a thickness from, for example, 0.1 nm to 500 nm, including all values to the 0.1 nm and ranges in between. In an embodiment, the layer 102 has a thickness from 2 nm to 20 nm, including all values to the 0.1 nm and ranges in between. For a metal film, the layer 102 may have a thickness from 0.1 nm to 100 nm or, more particularly, from 5 nm to 10 nm, including all values to the 0.1 nm and ranges in between. For a photoemissive film, the layer 102 may be from 0.1 nm to 500 nm, including all values to the 0.1 nm and ranges in between.

The layer 102 may be disposed on all outer surfaces of the emitter structure 101 or only part of the outer surfaces of the emitter structure 101. Thus, the layer 102 may only be disposed on the outer surface of the pyramidal, conical, or cylindrical sections of the emitter structure 101 rather than the base.

In an embodiment, the layer 102 includes an alkali halide. For example, the alkali halide can be CsI, CsBr, or CsTe. An alkali halide in the layer 102 can be used in an emitter structure 101 used as a photocathode. The alkali halide in the layer 102 can emit electrons with high quantum efficiency. A layer 102 with an alkali halide can have low impurity levels and acceptable uniformity. The layer 102 can be amorphous or polycrystalline, so defects may be present.

Photocathodes are electron sources that emit electrons when a substrate is exposed to a source of light, either in transmission or reflection mode. The substrate can be either a bulk material, a film, or a series of films deposited on a substrate, and the wavelength(s) of the light can be selected to optimize the amount of emission currents and energy spread of the emitted electrons. The current produced by photocathodes may be more stable than the current produced by cold field emitters. Many materials can be used for photoemission, including silicon itself or silicon with a metal coating.

In an embodiment, the layer 102 includes an alkali halide with a thickness from 0.1 nm to 100 nm, including all values to the 0.1 nm and ranges in between.

Coating the silicon emitter with an alkali halide film can combine the stable emission of a photocathode with the high brightness of a cold field emitter. The resulting emitters can emit electrons using a combination of field emission and photoemission (e.g., a process called photo-field emission). The high aspect ratio silicon structures with nanoscale diameter tips may act as a template on which to deposit the photoemissive material, so the high field enhancement of the silicon structures is preserved while providing emission stability.

In addition to making high aspect ratio silicon emitters that can produce beams of electrons when an external electric field is applied, silicon can be etched into sharpened tips and an integrated electrode, and one or more optional focusing gates can be fabricated directly onto the silicon wafer. A photoemissive material can be deposited on these emitters with integrated extractors during the fabrication process so that these emitters can be turned on using a combination of electric fields and light. The advantage of fabricating an integrated extractor or focusing gates on the wafer is the ability to have a great deal of control over the shape of the beam with low voltages.

An additional metal layer can be coated on the layer 102 when the layer 102 is a photoemissive material.

In another embodiment, the layer 102 is a metal, such as nickel, copper, iron, and/or platinum.

Figure 2:
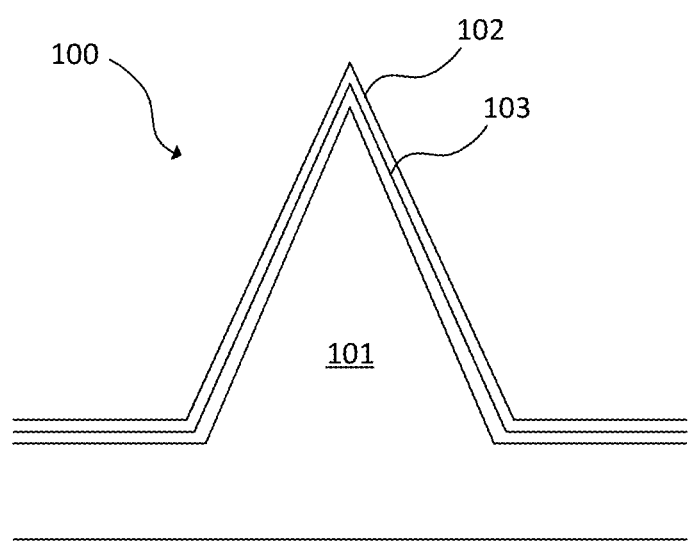
FIG. 2 is a cross-section diagram of an exemplary emitter structure with a metal layer in accordance with the present disclosure.

FIG. 2 is a cross-section diagram of an exemplary emitter structure 101 with a metal layer 103. The optional metal layer 103 is disposed between the emitter structure 101 and the layer 102.

In an instance, the metal layer 103 includes nickel, copper, iron, platinum, and/or ruthenium. The metal layer 103 can have low impurity levels and acceptable uniformity. The metal layer 103 can be amorphous or polycrystalline, so defects may be present.

In an embodiment, the layer 102 on the metal layer 103 is graphene. Use of the metal layer 103, such as nickel, copper, iron, and/or platinum, can act as a catalyst for growing a conformal graphene coating on the silicon emitter structure 101. Graphene, which can provide a source of electrons, typically grows as a uniform film on the surface of the metal layer 103. Graphene typically has a high crystallinity that can lead to desired brightness without the need of a crystal structure in the underlying metal layer 103.

In an embodiment, the metal layer 103 can be from 0.1 nm to 100 nm in thickness, including all values to the 0.1 nm and ranges in between. In an instance, the thickness of the metal layer 103 is from 5 nm to 10 nm, including all values to the 0.1 nm and ranges in between. In another instance, the thickness of the metal layer 103 is from 10 nm to 50 nm, including all values to the 0.1 nm and ranges in between. The graphene of the layer 102 is then grown on top. The graphene can be one or more layers thick.

Some defects may be present on a surface of the graphene, but impurities and defects in the graphene may be minimized. The graphene may have defects to compensate for curvature. Uniformity with acceptable coverage over a three-dimensional structure can be obtained.

Use of graphene in the layer 102 can enable stable operation with high brightness at $10^{-8}$ Torr vacuum levels and at room temperature without the need for high temperature flashing to clean adsorbate contamination. Graphene in the layer 102 can be used in a cold field emission mode.

In another instance, the layer 102 is photoemissive material, such as an alkali halide. The metal in the metal layer 103, which may be ruthenium or an alloy of ruthenium and platinum, provides improved adhesion between the emitter structure 101 and the layer 102. The metal layer 103 also can improve the conductivity to the layer 102 or provide an electrical path to the electrons so that the electrons do not need to pass through the silicon of the emitter structure 101.

The metal layer 103 can have low impurity levels and acceptable uniformity. The metal layer 103 can be amorphous or polycrystalline, so defects may be present.

An additional metal layer can be coated on the layer 102 when the layer 102 is a photoemissive material.

Figure 6:
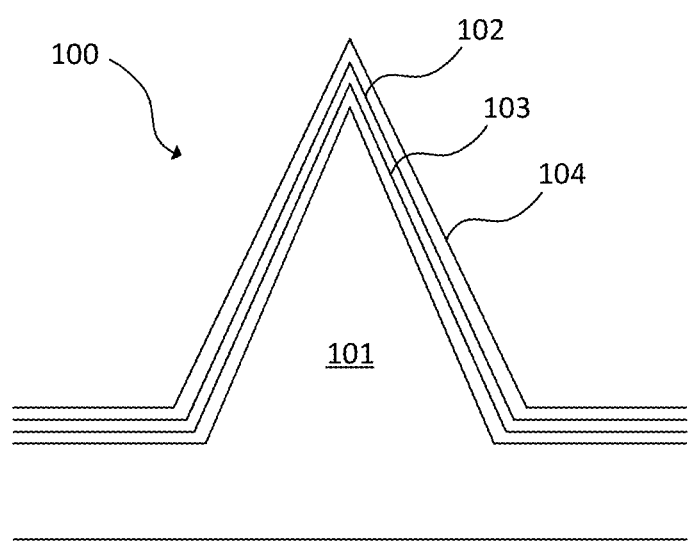
FIG. 6 is a cross-section diagram of an exemplary emitter structure with a protective coating.

FIG. 6 is a cross-section diagram of an exemplary emitter structure 101 with a protective coating 104. The protective coating 104 is disposed on the layer 102. In an instance, the layer 102 is a photoemissive material. The protective coating 104 may be a metal or other materials. The protective coating 104 can protect the layer 102 from environmental effects such as exposure to air, low vacuum, or adsorbates from the vacuum. Besides preventing degradation of the layer 102, the protective coating 104 also can enable a plasma clean of the emitter structure 100.

In an instance, the metal layer 103 is not used with the protective coating 104. Thus, only the layer 102 and protective coating 104 are disposed on the emitter structure 101.

While only a single emitter structure 100 is shown, a plurality of emitter structures 100 may be formed in a one-dimensional or two-dimensional array. Each of the emitter structures 100 in the array can generate an electron beam. Thus, either a single emitter structure 101 coated with the layer 102 or arrays of emitter structures 101 coated with the layer 102 can be produced. By controlling the electric field and/or exposure to light at each emitter individually, one or more of the emitters in the array can be turned on at the same time to produce either a single beam of electrons or an array of electron beams.

Embodiments of the electron source 100 can be used as the electron source in reticle and wafer inspection systems. For example, embodiments of the electron source 100 can be used as the electron source in electron beam wafer or reticle inspection systems using single or multiple electron sources, electron beam wafer or reticle review systems using single or multiple electron sources, or electron beam wafer or reticle metrology systems using single or multiple electron sources. Embodiments of the electron source 100 also can be used in systems for generation of x-rays using single or multiple electron sources for use of wafer or reticle metrology, review, or inspection. Embodiments of the electron source 100 may replace conventional Schottky sources in electron beam systems.

Figure 7:
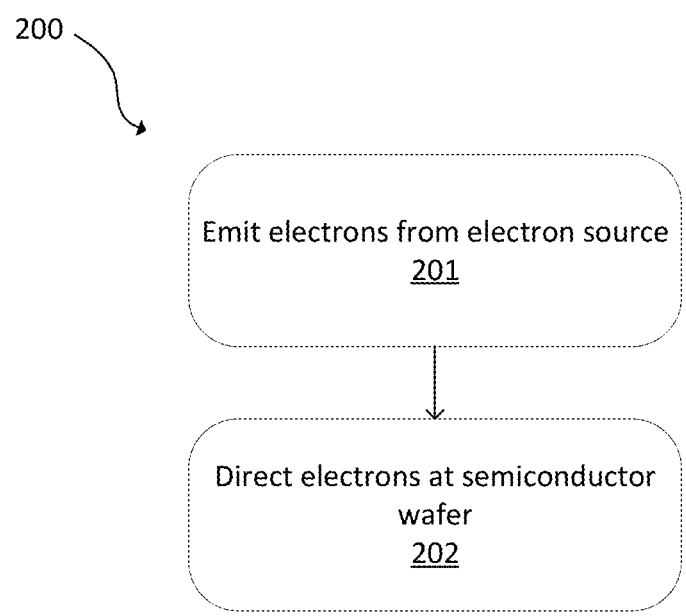
FIG. 7 is a flowchart of a method of operation in accordance with the present disclosure.

FIG. 7 is a flowchart of a method 200 of operation. In the method, electrons are emitted from an electron source at 201. The electron source can include an emitter structure that includes silicon and a layer disposed on an outer surface of the emitter structure. The layer can include graphene or can include a photoemissive material such as an alkali halide. At 202, the electrons are directed at a semiconductor wafer. This can be part of an inspection, metrology, or review process on the semiconductor wafer.

The emission can occur in a vacuum of $10^{-8}$ Torr or at a higher level of vacuum. For example, the vacuum may be from $10^{-10}$ Torr to $10^{-12}$ Torr.

The emission can occur at room temperature or warm mode with either a photoemissive material or graphene. Cold field emission can operate at room temperature. Warm field emission may occur at a temperature from above room temperature to approximately 500° C.

The emission can be cold field emission. In an instance, the layer includes a metal or a photoemissive material, such as an alkali halide, that is used for the cold field emission.

In an embodiment, the emission includes both field emission and photoemission. The layer can include a photoemissive material, such as an alkali halide.

In an embodiment, a graphene layer is used with cold field emission or warm field emission up to approximately 500° C.

Figure 8:
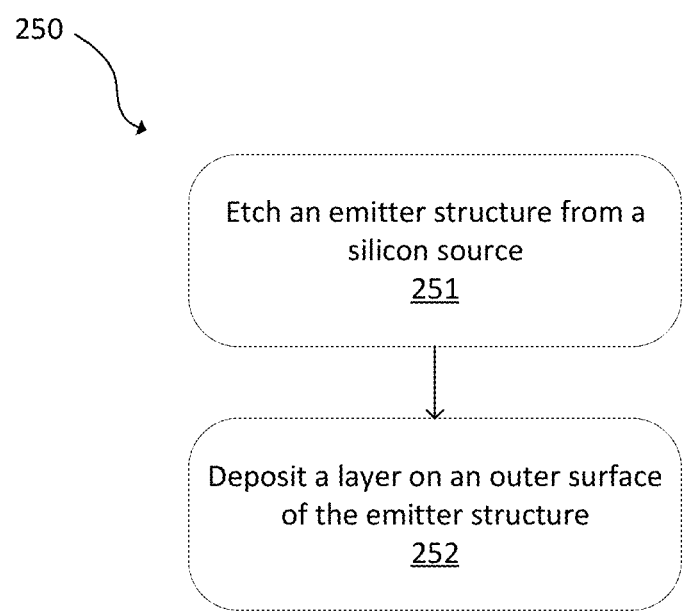
FIG. 8 is a flowchart of a method of manufacturing in accordance with the present disclosure.

FIG. 8 is a flowchart of a method 250 of forming an electron source. The method 250 includes etching an emitter structure from a silicon source at 251. A layer is deposited on an outer surface of the emitter structure at 252. The layer can include graphene or can include a photoemissive material such as an alkali halide.

An optional metal layer can be deposited on the outer surface of the emitter structure prior to depositing the layer. In an instance, the layer includes graphene and the metal layer includes nickel, copper, iron, or platinum. In another instance, the layer include and alkali halide with the metal layer.

An optional protective coating can be deposited on the layer.

In an embodiment, a plurality of emitter structures are produces. This can form an array of emitter structures.

Figure 9:
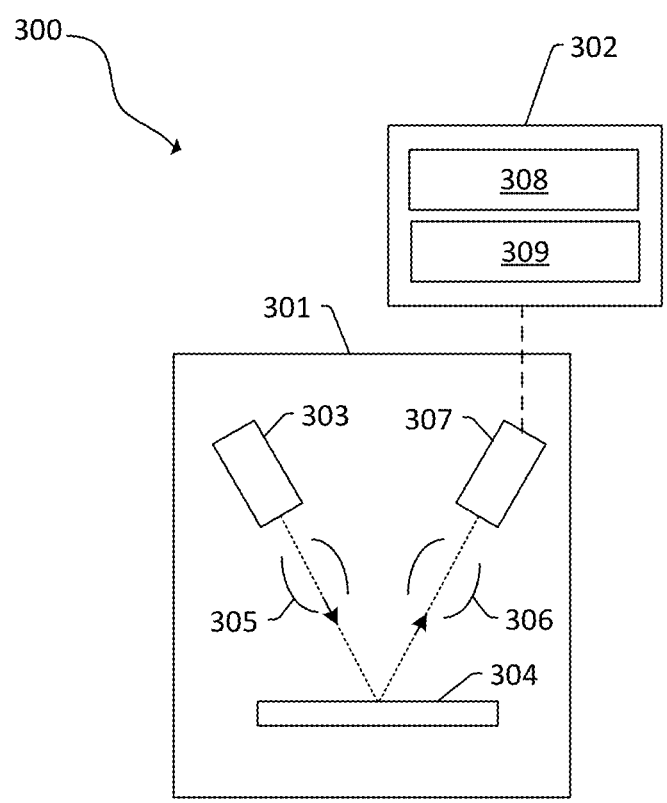
FIG. 9 is a block diagram of an embodiment of a system in accordance with the present disclosure.

FIG. 9 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 9, the output acquisition subsystem includes electron column 301, which is coupled to computer subsystem 302. A chuck (not illustrated) may hold the wafer 304.

As also shown in FIG. 9, the electron column 301 includes an electron beam source 303 configured to generate electrons that are focused to wafer 304 by one or more elements 305. The electron beam source 303 may include, for example, an embodiment of the electron source 100 described with respect to FIG. 1, FIG. 2, or FIG. 6. The electron beam source 303 can operate using an embodiment of the method 200. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The system 300 also can include a device that measures current and provides feedback stabilization using the voltage. This device can be used with metal-coated silicon emitters, graphene-coated emitters, and emitters coated with a photoemissive material.

The electron column also may include any other suitable elements known in the art.

Although the electron column 301 is shown in FIG. 9 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.).

The multiple modes of the electron beam-based output acquisition subsystem may be different in any image generation parameters of the output acquisition subsystem.

Computer subsystem 302 may be coupled to detector 307 such that the computer subsystem 302 is in electronic communication with the detector 307 or other components of the wafer inspection tool. The detector 307 may detect electrons returned from the surface of the wafer 304 thereby forming electron beam images of the wafer 304 with the computer subsystem 302. The electron beam images may include any suitable electron beam images. The computer subsystem 302 includes a processor 308 and an electronic data storage unit 309. The processor 308 may include a microprocessor, a microcontroller, or other devices.

It is noted that FIG. 9 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage unit 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

The system 300 of FIG. 9 is merely one example of a system that can use the electron source 100. Embodiments of the electron source 100 may be part of a defect review system, an inspection system, a metrology system, or some other type of system. Thus, the embodiments disclosed herein describe some configurations that can be tailored in a number of manners for systems having different capabilities that are more or less suitable for different applications.

The graphene-based emitter array or emitter array coated with a photoemissive material can provide improved performance to the system 300. In an embodiment, the system 300 uses an array of the electron source 100 with a layer 102 of graphene. The electron source 100 is configured in a 10×10 array with a pitch as low as 15 mm. A conventional array of Schottky TFE operates at 1800 K in a $10^{-10}$ Torr vacuum, which makes it difficult to operate and sensitive to contamination from the wafer, which may be approximately 20 mm away. In addition, the conventional array is bulky and difficult to align to the extractor electrodes.

The following examples are illustrative and are not meant to be limiting.

EXAMPLE 1

Figure 3:
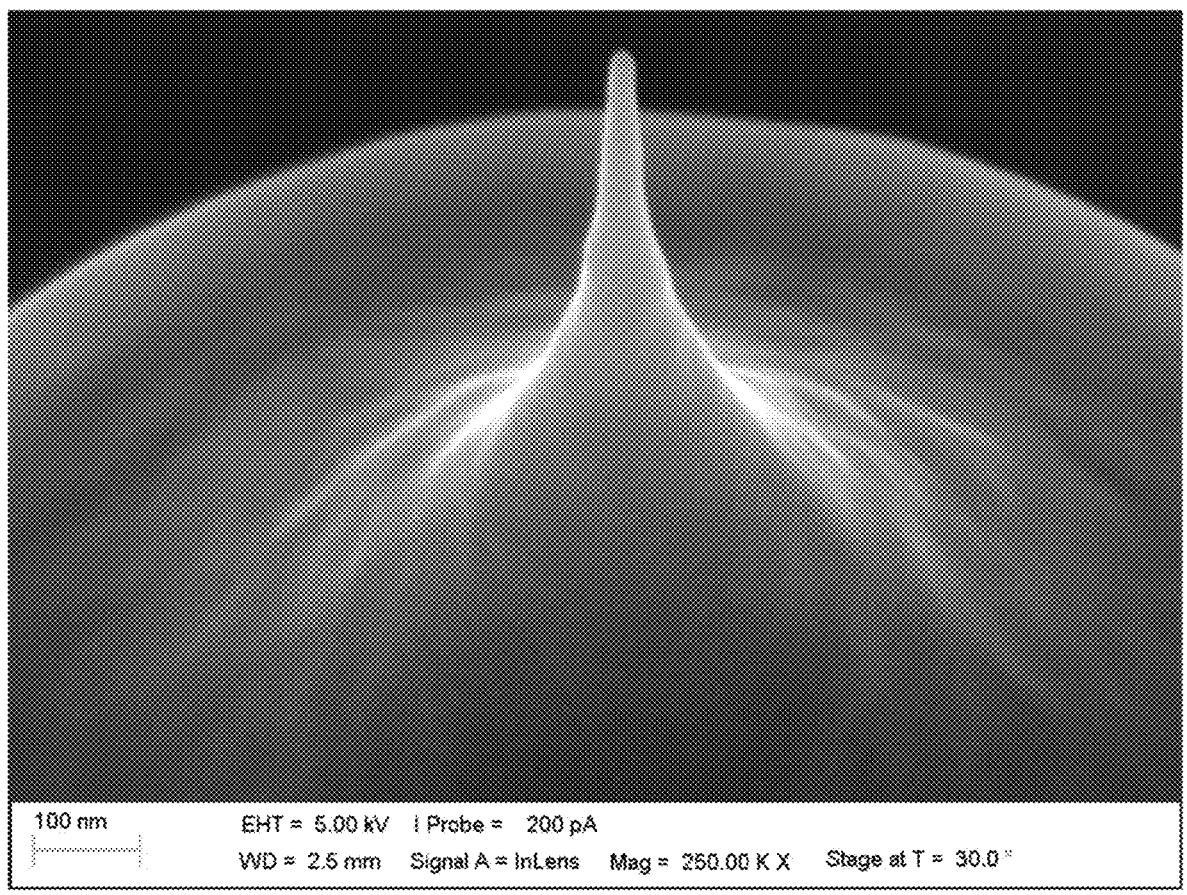
FIG. 3 is an exemplary sharp silicon tip having an approximately 15 nm radius at the tip.
Figure 4:
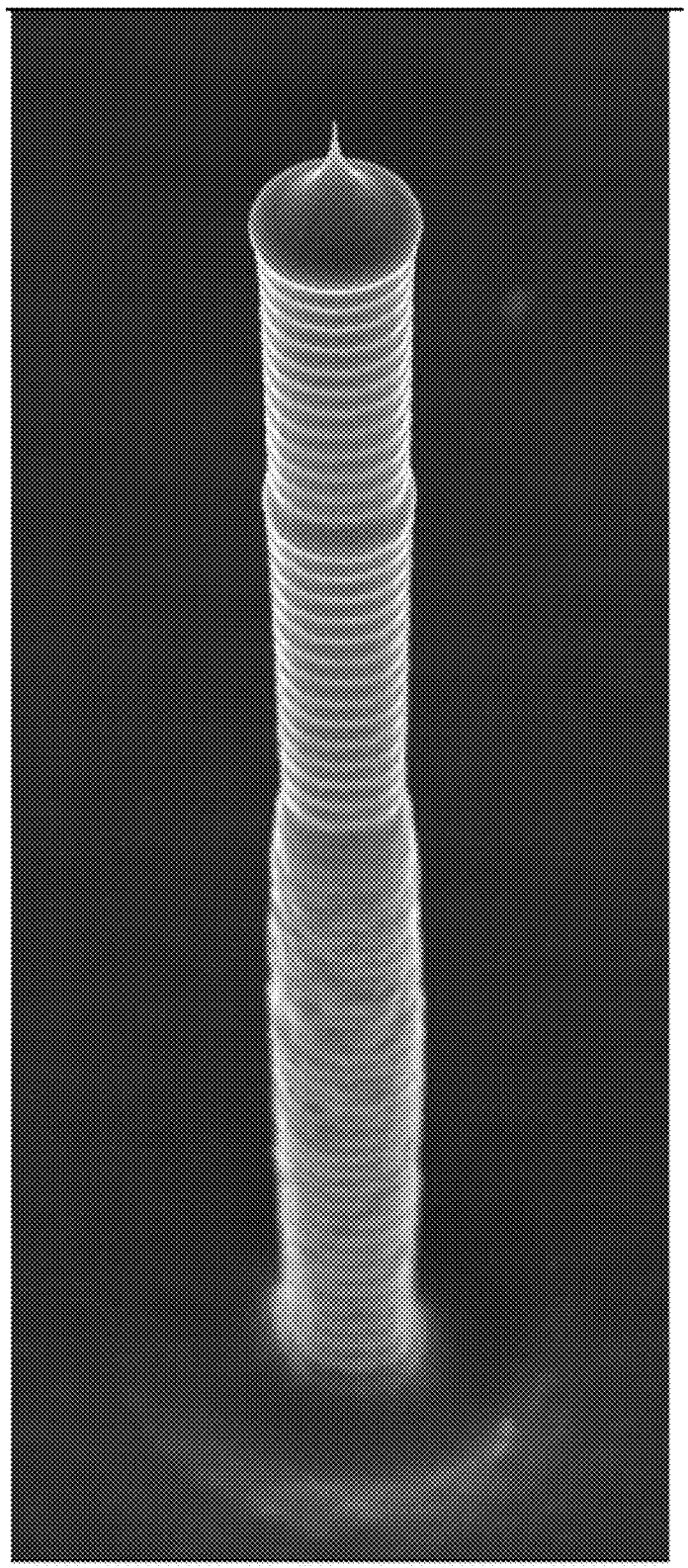
FIG. 4 is a silicon high field enhancement factor rod having a diameter of approximately 1.5 µm and a height of approximately 20 µm.
Figure 5:
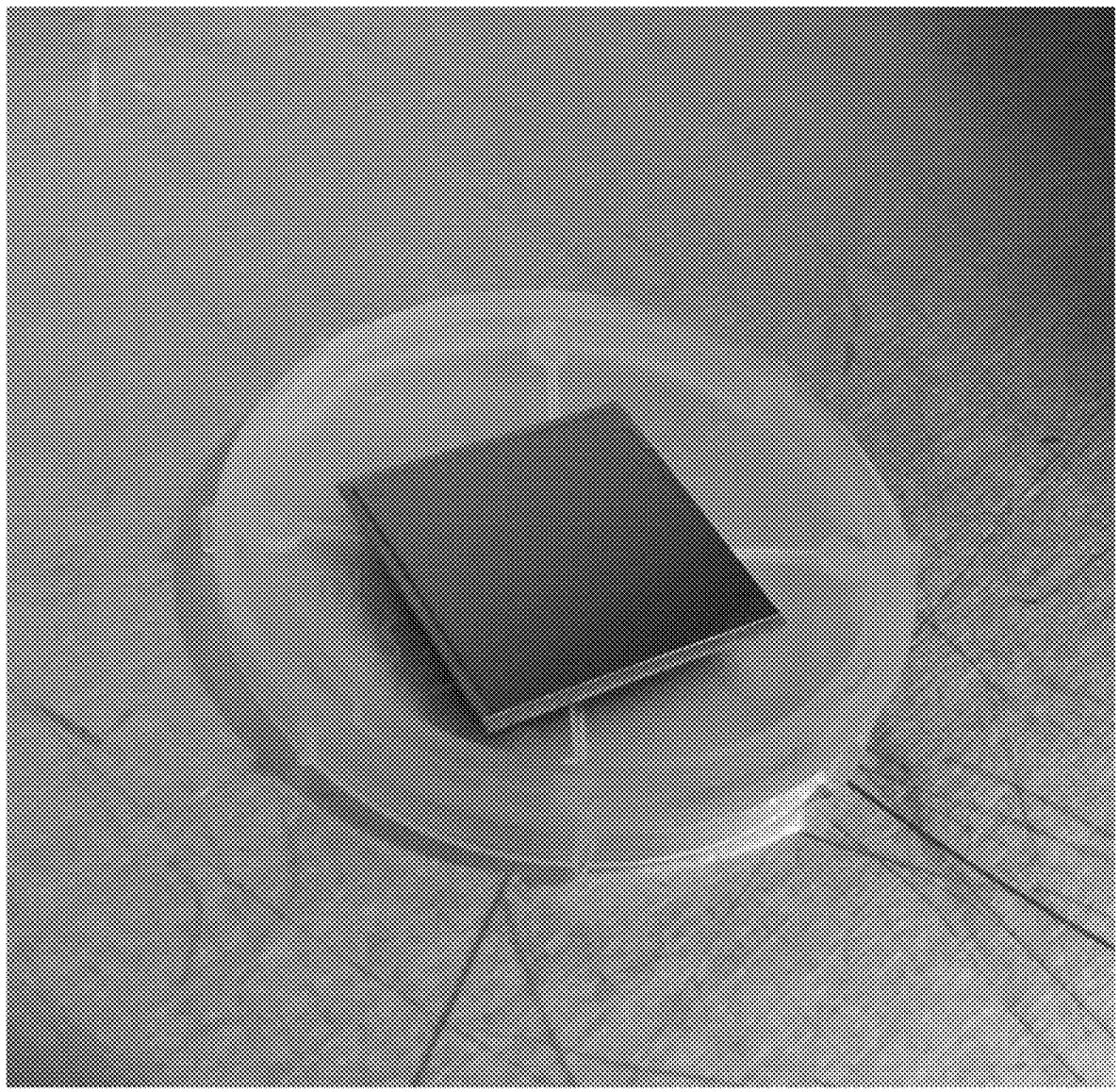
FIG. 5 is a 25 mm square with silicon emitter tips on a 500 µm pitch.

In an example, graphene is deposited on silicon emitter structures. Thin film deposition, etching, and lithographic techniques were used to fabricate an array of high field enhancement ratio silicon columns approximately 1.5 microns in diameter and 20 microns tall having sharp tips with radii on the order of 5-20 nm on a silicon wafer. This can be seen in FIGS. 3-5. The emitter tips were laid out on a 500 micron pitch, and only the tip aligned to the cone-shaped extractor electrode atop the electron column can be activated. In this manner, a spare tip can be activated by moving the emitter chip 500 microns in either X or Y, and there can be many replacement tips if desired. These silicon can react with ambient oxygen and water to form $SiO_x$ that causes breakdown of the emission mechanism. Carbon nanotubes have been shown to be a source of high brightness electron beams with an energy spread in the order of 0.3 eV, but it can be difficult to fabricate an array of carbon nanotubes with uniform geometries (including height and diameter), especially for an emitter array that is coupled with an array of micro columns. It is possible to etch an emitter, such as a silicon emitter, with uniform geometries. Non-uniform carbon nanotubes may not be a problem because operating conditions for each column can be adjusted to compensate for any non-uniformities.

The periodic base structure manufactured with lithography on a silicon wafer can then be coated with a thin (from 10 nm to 50 nm thick) metal layer (e.g., nickel or copper) that serves as a catalyst to grow a uniform monolayer or multiple layers of graphene using chemical vapor deposition (CVD) or thermal chemical vapor deposition (TCVD). This outer graphene layer then acts as a high brightness electron source with low energy spread. In addition, because of the low chemical sensitivity of the graphene, the emitter can operate at room temperature in contrast with Schottky emitters that operate at 1800 K or tungsten CFE emitters that have to be periodically flashed to 1000° C. to clean adsorbate contamination. Electron emitters with a graphene coating have been demonstrated to perform stably at vacuum levels of $10^{-8}$ Torr because of the low chemical sensitivity of the graphene, which eases the requirements for vacuum inside the vacuum chamber.

EXAMPLE 2

The graphene can be applied to the coated silicon substrate using electrophoretic deposition (EPD). In this method, a colloidal suspension of chemically exfoliated graphene flakes with $Mg(NO_3)_2 * 6H_2O$ as a charger/binder element is used to coherently coat the emitters under the influence of an electric field in a coating cell. This has been demonstrated to produce a uniform coating of graphene. The graphene can be deposited on the silicon emitters directly or on the silicon emitters coated with a metal thin film. It is possible to address the edge orientation of the sheets if they occur near the tip. Emission from the sheet edge is much more efficient that the flat-matrix carbon atoms because of the field enhancement factor.

EXAMPLE 3

Silicon emitters with an alkali halide film are produced. The silicon emitters coated with an alkali halide film can be heated to a low temperature and operate in a warm mode to further improve the emission current stability by creating a more thermodynamically stable emission surface. The temperature is configured so that the energy spread is kept low and the brightness remains high. A combination of field enhancement, light excitation of electrons, and heating can optimize emission stability, brightness, and energy spread of the emitter electrons.

The thickness of the photoemissive film may be an important parameter to optimize for maximum quantum efficiency and minimum heat dissipation. For a specific illumination wavelength, the film thickness can determine the amount of absorbed light and the penetration depth. For ultraviolet wavelengths, the use CsI and CsBr films from approximately 2 nm to 20 nm can be used for 266 nm or shorter wavelengths.

Photocathodes can be more stable electron sources than cold field electron sources. Microfabricated silicon emitters with nanoscale diameter tips can produce an electron beam with high brightness in cold field emission, and these silicon emitters are used as a template to coat them with a photoemissive material. The resulting photo-assisted cold field electron source can have a combination of high brightness, low energy spread, and high stability.

EXAMPLE 4

Silicon cold field emitters are fabricated starting from a silicon wafer. Either single or arrays of multiple sharpened silicon emitters may be fabricated. Optional extractor and/or focusing electrodes can be integrated onto the wafer.

A photoemissive material is deposited as a thin film onto the silicon emitters after the tip has been sharpened. For example, alkali halide films are deposited onto the silicon emitters using an effusion cell inside of a clean vacuum chamber.

If an integrated extractor is included on the wafer, then the photoemissive material can be deposited either before or after depositing the extractor if the effusion cell deposition is directional and not conformal, and does not short-circuit the emitter to the extractor gate.

The photo-assisted cold field emitters can be used as electron sources inside of a vacuum chamber. The vacuum chamber can operate in the $10^{-10}$ Torr range or lower. The silicon emitters with a photoemissive coating are fabricated on a silicon chip or on diamond tip. An electrical contact is made to the chip, and a large negative voltage is applied to the chip. A grounded extractor is approached towards an emitter, and the emitter is exposed to a light source. An aperture in the extractor can let electrons pass through, and current can optionally be collected at a grounded detector. Picoammeters are used to measure the current from the chip, the extractor, and the detector.

Optionally, after fabrication, an emitter could be removed from the chip (using a focused ion beam (FIB) or SEM tool) and, for example, be welded to a heating filament.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron source comprising:
    an emitter structure that includes silicon;
    a layer disposed on an outer surface of the emitter structure, wherein the layer includes or a photoemissive material, wherein the photoemissive material is an alkali halide, and wherein the alkali halide includes CsI, CsBr, or CsTe.

2. The electron source of claim 1, further comprising a metal layer disposed between the emitter structure and the layer.

3. The electron source of claim 1, further comprising a protective coating disposed on the layer.

4. The electron source of claim 1, wherein the layer has a thickness from 0.1 nm to 500 nm.

5. A plurality of the electron sources of claim 1, wherein the plurality of the electron sources forms an array.

6. The electron source of claim 1, wherein the emitter structure has a diameter from 1 nm to 30 nm.

7. The electron source of claim 1, wherein the emitter structure defines a tip with a radius from 5 nm to 20 nm.

8. A method comprising:
    emitting electrons from an electron source comprising an emitter structure that includes silicon and a layer disposed on an outer surface of the emitter structure, wherein the layer includes a photoemissive material, wherein the photoemissive material is an alkali halide, and wherein the alkali halide includes CsI, CsBr, or CsTe.

9. The method of claim 8, wherein the emitting occurs in a vacuum from $10^{-10}$ Torr to $10^{-12}$ Torr.

10. The method of claim 8, wherein the emitting occurs at room temperature.

11. The method of claim 8, wherein the emitting is cold field emission.

12. The method of claim 8, wherein the emitting occurs at a temperature greater than room temperature and less than 500° C.

13. The method of claim 8, wherein the emitting includes both field emission and photoemission.

14. A method of forming an electron source comprising:
   etching an emitter structure from a silicon source; and
   depositing a layer on an outer surface of the emitter structure, wherein the layer includes a photoemissive material, wherein the photoemissive material is an alkali halide, and wherein the alkali halide includes CsI, CsBr, or CsTe.

15. The method of claim 14, further comprising depositing a metal layer on the outer surface of the emitter structure prior to depositing the layer.

16. The method of claim 14, further comprising depositing a protective coating on the layer.

* * * * *